United States Patent [19]
Chazan et al.

[11] Patent Number: 6,165,892
[45] Date of Patent: Dec. 26, 2000

[54] METHOD OF PLANARIZING THIN FILM LAYERS DEPOSITED OVER A COMMON CIRCUIT BASE

[75] Inventors: David J. Chazan, Palo Alto; Ted T. Chen, Saratoga; Todd S. Kaplan, Mountain View; James L. Lykins; Michael P. Skinner, both of San Jose; Jan I. Strandberg, Cupertino, all of Calif.

[73] Assignee: Kulicke & Soffa Holdings, Inc., Willow Grove, Pa.

[21] Appl. No.: 09/127,580

[22] Filed: Jul. 31, 1998

[51] Int. Cl.⁷ .................................................. H01L 21/4763
[52] U.S. Cl. ........................... 438/623; 438/584; 438/618; 438/622
[58] Field of Search .................................... 438/623, 622, 438/618, 584

[56] References Cited

U.S. PATENT DOCUMENTS

| | | | |
|---|---|---|---|
| 5,153,384 | 10/1992 | Iijima et al. | 174/257 |
| 5,326,671 | 7/1994 | Brown et al. | 430/311 |
| 5,373,627 | 12/1994 | Grebe . | |
| 5,516,625 | 5/1996 | McNamara et al. | 430/314 |
| 5,580,826 | 12/1996 | Matsubara et al. | 437/195 |
| 5,702,977 | 12/1997 | Jang et al. | 437/67 |
| 5,756,395 | 5/1998 | Rostoker et al. . | |
| 5,891,795 | 4/1999 | Arledge et al. . | |

FOREIGN PATENT DOCUMENTS

| | | | |
|---|---|---|---|
| 0 260 857 A2 | 3/1988 | European Pat. Off. | H01L 23/48 |
| 0 599 075 | 6/1994 | European Pat. Off. . | |
| 0 605 090 A1 | 7/1994 | European Pat. Off. | H01L 21/316 |

*Primary Examiner*—Kevin M. Picardat
*Assistant Examiner*—D. M. Collins
*Attorney, Agent, or Firm*—Townsend and Townsend and Crew LLP

[57] ABSTRACT

A method for forming a planarized thin film dielectric film on a surface of a common circuit base upon which one or more integrated circuits are to be attached. The common circuit base includes raised features formed over its surface such that the raised features define a trench area between them. The method includes the steps of forming a first layer of the dielectric film over the common circuit base and over the raised features and the trench, then patterning the newly formed layer to remove portions of the layer formed over the raised features and expose the raised features. After the layer is patterned, formation of the dielectric film is completed by forming a second layer of the dielectric film over the patterned first layer. Additional film deposition and film patterning steps are performed to complete the layout of a thin film interconnect structure over said common circuit base, and an integrated circuit die is attached to the common circuit base and electrically connecting to the thin film interconnect structure. In a preferred embodiment, the first and second layers of the dielectric film are both formed from a photo-definable material and the patterning step includes exposing the first layer to light through a patterned mask corresponding to the raised features and developing the exposed layer with a developing solution to etch away portions of the first layer formed over the raised features.

21 Claims, 4 Drawing Sheets

METHOD OF PLANARIZING THIN FILM LAYERS DEPOSITED OVER A COMMON CIRCUIT BASE

BACKGROUND OF THE INVENTION

The present invention relates the use of thin film deposition technology to create high density interconnects on a conventional printed wiring board substrate. More specifically, the present invention pertains to an improved method for planarizing thin film dielectric layers formed on the substrate surface in preparation for the formation of subsequent layers. The method of the present invention can be used with or without conventional build-up layers (e.g., a planarized dielectric layer deposited over the upper surface of a completed printed wiring board substrate, typically by the substrate manufacturer, that has a corresponding dielectric layer deposited over the lower surface of the substrate to counterbalance the stress of the upper build-up layer) and is useful for high density integrated circuit packaging of single chip, multi-chip, and support components such as resistors and capacitors. The method of the present invention is also useful for creating interconnections on high density daughter boards that carry packaged devices.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface the chips with the outside world and interconnect the chips to other integrated circuit devices.

A number of different technologies have been developed to interconnect multiple integrated circuits. One such technology, based on traditional printed wiring board (PWB) technology that found wide use during the period in which integrated circuits were packaged in surface mount devices like quad flat packs (QFPs), is often referred to as MCM-L or laminate MCM technology. MCM-L technology typically uses copper and insulating dielectric material sub-laminates as building blocks to create required interconnect structures. The process of forming a copper conductive pattern on the sub-laminate in MCM-L technology typically includes forming a dry film of photo resist over the copper layer, patterning and developing the photoresist to form an appropriate mask and selectively etching away the unwanted copper thereby leaving the desired patterned conductive layer.

Substrates used in MCM-L technology can be manufactured in large area panels providing efficiencies that lower the costs of production. Interconnect solutions using this technology generally have relatively good performance characteristics because of the copper and low dielectric constant materials (e.g., less than or equal to 4.0) employed. The printed wiring board industry, however, has not kept pace with the advances in semiconductor manufacturing in terms of pad density. As a result, there is a capability gap between semiconductor manufacturers and interconnect printed wiring board manufacturers.

In some applications, two or more pieces of laminate are laminated together to form a final structure. Interconnection between the laminated layers can be provided by through hole mechanical drilling, followed by plating. The drilling process is relatively slow and expensive and can require a large amount of board space. As the number of interconnect pads increases, an increased number of signal layers is often used to form the interconnect structure. Because of these limitations, the conventional printed wiring board technology needs to go to a large number of metal layers (e.g., greater than eight layers) for some of the applications in high density integrated circuit packaging and daughter board fabrication. Utilizing a large number of layers in this context generally increases cost and decreases electrical performance. Also, the pad size limits the wiring density on any given layer with this technology. Thus, MCM-L technology, while useful for some applications, is not capable of providing the connection density required in other applications.

To improve the interconnect density of MCM-L technology, an advanced printed wiring board technology approach called build-up multi-layer has been developed. In this technology a traditional printed wiring board core is the starting point. Standard drilling and plating techniques are used to form vias in the core. From the basic core this conventional build-up approach has many variations. Typically a dielectric layer approximately 50 micrometers thick is laminated to both the top and bottom major surfaces of the conventionally fabricated printed wiring board substrate. Vias are made in the build-up layer by laser ablation, photo mask/plasma etching or other known methods. An electroless seeding step is then done prior to a panel plating step that metalizes both of the upper and lower surfaces. Subsequent masking and wet etching steps then define a desired conductive pattern over the laminated dielectric layers.

This technology offers a large improvement in terms of density over MCM-L technology without build-up layers; however, such build-up boards require multiple layers in order to meet the developing high density packaging and daughter board requirements. Thus this technology still has limitations.

Another conventional approach used to package high density input/output uses thick film (screen printing) over cofired ceramic substrates. This technology is sometimes referred to as MCM-C, cofired ceramic MCM and thick film MCM technology. Basically, MCM-C technology involves rolling a ceramic mix into sheets, drying the sheets, punching the vias, screening the rolled sheet with a metal paste representing the trace pattern on the surface of the ceramic, stacking and laminating all the layers together, then cofiring at a high temperature (e.g., greater than 850° C.) to achieve the desired interconnections.

MCM-C construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high density packaging applications (e.g., greater than 1000 pads), it is also very costly. Additionally, performance characteristics, such as signal propagation time, are impacted due to the relatively high dielectric constant (e.g., between 5.0 and 9.0) of the ceramic materials. MCM-C technology provides a higher connection density than some MCM-L technology, but is still not capable of providing the connection density required for some of today's high density interconnect applications.

A third approach which the high density interconnect and packaging industry has moved toward to address these high density interconnect applications uses thin film MCM technology and is sometimes referred to as MCM-D or MCM deposition technology. MCM-D technology includes forming and patterning thin film conductive traces over a common circuit base.

In some applications, MCM-D technology utilizes a low cost, large surface area printed wiring board structure, with or without the use of the conventional build-up multi-layers on the printed wiring board, as the common circuit base and as a starting point to meet the high density and low cost interconnect requirements. Such large substrates may have a surface area of 40 cm×40 cm or more, thereby providing efficiencies that lower the costs of production. This combination of existing conventional high volume printed wiring board technology and advanced thin film deposition technology represents a significant economic advantage and density improvement as compared to the previously discussed MCM-L and MCM-C methods.

One significant feature of MCM-D technology is that it creates a high interconnect density substrate using thin film processes on only one side of the common circuit base. The high density interconnects are formed by depositing alternating conducting and insulating thin film layers. The total thickness of several of these deposited layers is less than the thickness of a single conventional build-up layer. This eliminates the need for balancing the build-up layers on both top and bottom to prevent warpage of the substrate.

The MCM-D process involves first laying down a layer of an insulating dielectric on the top surface of a common circuit base, depositing a conductive material over the dielectric layer, creating a circuit pattern in the conductive material, then depositing the next insulating and conductive layers. The various layers so created are connected through vias constructed using a variety of known techniques such as wet chemical etch, photo expose and develop or laser ablation. In this way a three dimensional deposited laminated structure is achieved enabling high density interconnect patterns to be fabricated in small physical areas.

Despite the definite advantages of MCM-D technology, there are potential problems that may result in failure modes and performance limitations if the thin film formation is not properly implemented. One important aspect of proper thin film layer formation is achieving sufficient planarization. The surface of a typical high density interconnect printed wiring board substrate has relatively coarse features. For example, vertical heights of the plated through hole are often about 35 microns above the substrate surface. At the same time, the space between these surface features may be as small as 0.14 or 0.15 millimeters in some areas of the substrate and may be significantly greater than this in other areas. This creates a deep trench with a low aspect ratio which must be leveled, or planarized, in order to make effective use of the thin film deposition technology for the deposited laminated layers.

A number of different problems either arise from or are exacerbated by improper or insufficient planarization. For example, insufficient planarization may lead to cracking of one or more of the thin film dielectric layers (a problem particularly acute at the interface between the laminated substrate and first thin film layer and alignment problems during subsequent photolithography steps among other problems. These problems tend to be magnified when two or more thin film conductive layers are formed over the laminated substrate.

There have been numerous methods developed over time to achieve a satisfactory planarization of these thin film dielectric layers. These methods include mechanical polishing, extrusion deposition, extrusion deposition combined with spinning, dual coating methods, squeegee techniques, the use of high viscosity dielectrics, tenting using thermal set materials, curtain coating, meniscus coating, roller coating and combinations of some of the above. Mechanical polishing, while fast, generally lacks accuracy. Extrusion methods have had some success, but uniformity continues to be a problem and is very sensitive to viscosity. An alternative is to extrude the dielectric, then add a spin cycle. Although the result is somewhat improved, it still does not provide the requisite level of planarity. Tenting techniques have also been somewhat successful but suffer from both lack of control and relatively high stress created as the result of thick dielectric requirements.

Current known roller coating methods do not allow coatings to be sufficiently thin for thin film deposition. Meniscus coating, while potentially adequate, suffers from very low throughput making it inappropriate for production environments. Various spraying methods of high viscosity materials have been used but the lack of uniformity due to temperature sensitivity and viscosity control issues continues to plague these methods.

Accordingly, improved planarization methods are desirable for thin film MCM-D technology.

SUMMARY OF THE INVENTION

The present invention provides a solution to the above-described planarization problem. The invention enables a highly planar dielectric surface to be formed on a high density interconnect printed wiring board substrate structure utilizing thin film deposited laminated layers. The present invention is capable of forming interconnects having minimum wire pitches on the order of 12–40 microns or less on large surface area printed wiring board substrates (e.g., substrates having a total surface area of 1400 to 2700 square centimeters or more). Thus, the present invention minimizes the effects of the problems discussed above and does so in an economically attractive process that is able to meet the needs of today's high density interconnect applications.

According to the method of the present invention, a planarized dielectric film is formed over the top surface of a high density interconnect printed wiring board substrate or common circuit base (defined subsequently in the Detailed Description of this application) which one or more integrated circuits are to be attached. The common circuit base includes raised features formed over its surface such that the raised features define a trench area between them. The method includes the steps of forming a first layer of the dielectric film over the common circuit base and over the raised features and the trench, then patterning the newly formed layer to remove portions of the layer formed over the raised features. After the layer is patterned, formation of the planarized dielectric film is completed by forming a second layer of the dielectric film over the patterned first layer. Additional film deposition and film patterning steps can then be performed to complete the layout of a thin film interconnect structure over the common circuit base, and an integrated circuit die can be attached to the common circuit base and electrically connecting to the thin film interconnect structure.

In a preferred embodiment, the first and second layers of the dielectric film are both formed from a photo-definable material and the patterning step includes exposing the first layer to light through a patterned mask corresponding to the raised features and developing the exposed layer with a developing solution to remove portions of the first layer formed over the raised features. In an even more preferred embodiment, the photo-definable first dielectric layer is exposed to light through a negatively biased mask that aligned between three to five microns from the edges of the raised features. In another embodiment, the photo-definable dielectric material is a cardo acrylate material that includes a polymer dielectric dissolved into a solvent(s).

These and other embodiments of the present invention, as well as its advantages and features, are described in more detail in conjunction with the text below and attached figures.

DETAILED DESCRIPTION OF PREFERRED EMBODIMENTS

Figure 1:
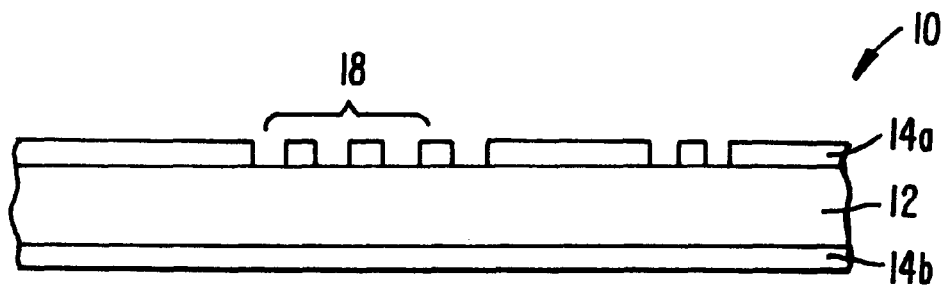
FIG. 1 is a simplified cross-sectional view of a laminated printed wiring board substrate.

FIG. 1 is a simplified cross-sectional view of a high density laminated printed wiring board substrate 10. The laminated substrate is formed from a single layer of insulating material 12, generally an organic polymer material such as FR4 or FR5 epoxy resin, and has copper sheets 14a and 14b laminated to its upper and lower surfaces, respectively. A desired conductor pattern is formed on the copper, by, for example, photo lithography, then the substrate is placed in a wet chemical etch to remove the unwanted copper, leaving the desired circuit pattern 18. Several of these sub-laminates with the circuit patterns can be laminated together to form a four-layer printed wiring substrate as shown in FIG. 2.

Figure 2:
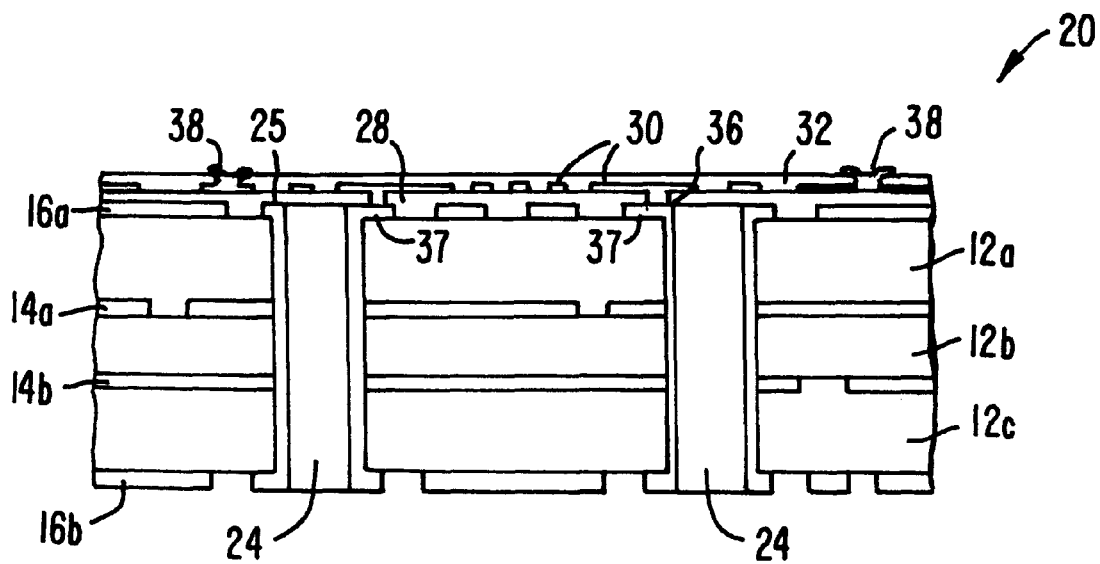
FIG. 2 a simplified cross-sectional view of a four-layer laminated printed wiring board substrate having a thin film interconnect structure formed thereon according to one embodiment of the present invention.

FIG. 2 is a simplified, cross-sectional view of a four-layer printed wiring board substrate 20 according to the present invention. Substrate 20 includes three sub-laminate substrate layers 12a, 12b and 12c. Layer 12b has upper and lower conductive layers 14a and 14b, while layer 12a includes an upper conductive layer 16a and layer 12b includes a lower conductive layer 16b. Internal conductive layers 14a and 14b are used for power and ground planes and to provide stiffness. Plated through holes 24 form connections between the conductive layers on the upper and lower surfaces of substrate 20 while buried through vias (not shown) form connections to and between internal layers 14a and 14b. Four-layer substrates, such as substrate 20 just described with layers 14a, 14b, 16a and 16b, can be purchased from substrate manufactures such as International Business Machines Corporation (IBM) and MicroVia Corporation.

Also shown in FIG. 2 is a high density signal interconnect structure formed using MCM-D technology over four-layer printed wiring board substrate 20. The high density interconnect structure includes a thin film dielectric layer 28, a thin film metalization layer (e.g., chrome/copper) 30, and a thin film dielectric passivation layer 32. It is important to note that the thickness of the various layers shown in FIG. 2 are not drawn to scale. In a typical, exemplary application, metalization layers 14a, 14b are about 35 microns thick and metalization layers 16a and 16b are about 20 microns thick. In contrast and in the same exemplary application, thin film dielectric layers 28 and 32 are deposited to a thickness of between 10 to 12 microns and metalization layer 30 is about 5 microns thick. A person of ordinary skill in the art will realize that the actual thicknesses of each of the layers shown in FIG. 2 may vary.

Metalization layer 30 is the only thin film conductive layer deposited over substrate 20 in the embodiment of the present invention shown in FIG. 2. In other embodiments of the present invention, two or more separate metalization layers 30 may be deposited over substrate 20 and separated by separate dielectric layers 28.

Interconnects 36 are formed between layers 14 and 30 by photo expose and develop cycles, laser ablation or plasma etch methods depending on the type of dielectric material used. Vias 38 in the top of passivation 32 layer provide the high density solder connection pads for an integrated circuit device that can be electrically connected to substrate 20 by, for example, wire bonding or flip chip techniques as is understood by a person of ordinary skill in the art. Electrical connections are made through filled plated through holes 24, which may or may not be metal capped and which are connected to pads 37, to provide the low density solder connection pads that interface to the next level on the lower surface of four-layer substrate 20.

In a preferred embodiment of the present invention, metalization layers 14a, 14b, 16a and 16b are formed from copper foil laminated to the top and/or bottom surfaces of sublaminates 12a, 12b and 12c as indicated above. Layers 14a and 14b are about 35 microns thick, while layers 16a and 16b are slightly thinner, about 20 microns. Sublaminates 12a, 12b and 12c are made from Mitsubishi BT HL830 resin dielectric.

In this embodiment, thin film dielectric layer 28 is a 10 micron layer of a photo definable cardo acrylate material, such as Nippon Steel Chemical V-259PA having a viscosity rating of 5, deposited by spin coating as understood by a person of ordinary skill in the art. Metalization layer 30 is a chrome/copper/chrome metal stack (chrome being the base and top layers and copper being the middle layer) deposited from, for example, a sputtering process as known to those of skill in the art. Alternatively, layer 30 can be another other copper metallurgy (e.g., copper, chrome/copper, chrome/copper/nickel/gold, chrome/copper/palladium or copper/palladium among others) and can be deposited from a plating process as would also be known to those of skill in the art. Dielectric layer 34 is also a spin-coated Nippon Steel Chemical V-259PA layer.

As discussed above in the Background of the Invention section, it is important to sufficiently planarize dielectric layer 28 prior to the formation of layers 30 and 32. A typical prior art process used to form a thin film dielectric layer such as layer 28 places a quantity of dielectric material in the middle of the substrate and then spins the substrate to spread the material over the entire substrate surface. Ideally, this coat would be such that the dielectric material would form an even, planarized surface across the entire top surface of the substrate. Characteristics of the dielectric, however, result in the material forming high spots over raised features of layer 14*b*, such as patterned metal lines 18 and plated through hole capture pads 25, and forming low spots in the spaces or trenches between the raised features.

Figure 3:
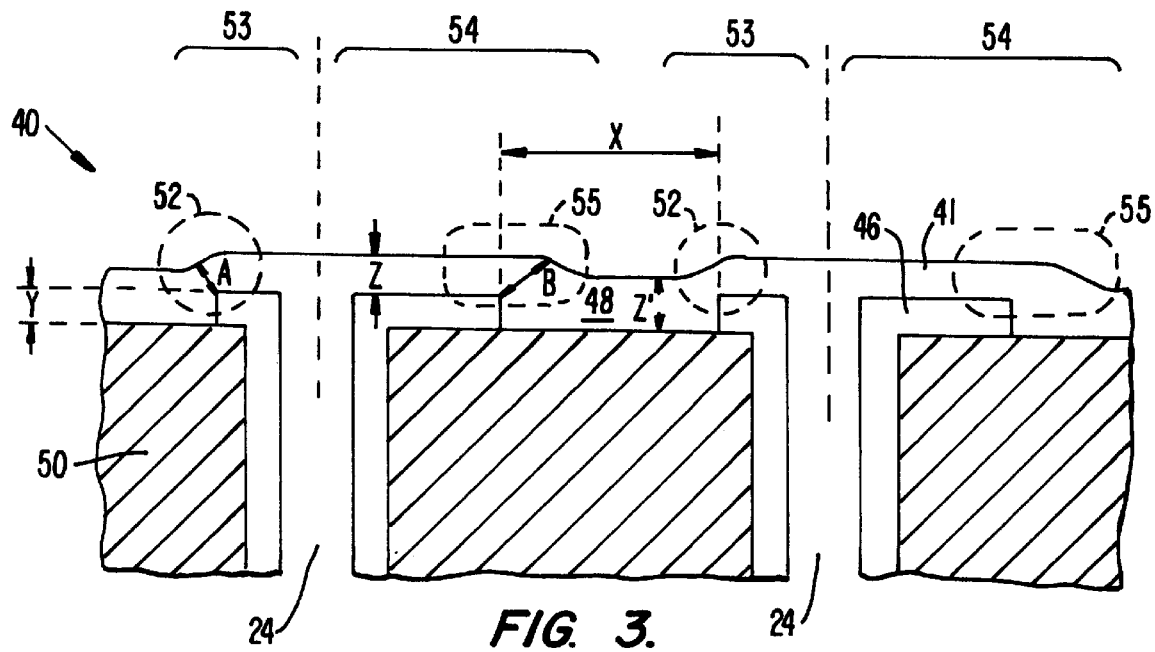
FIG. 3 is a simplified cross-sectional view of the top surface of a laminated substrate such as the printed wiring board substrate shown in FIGS. 1 or 2 having a thin film dielectric layer deposited over the upper surface of the substrate.

FIG. 3 illustrates an exaggerated profile of a spin-coated dielectric layer 41, when deposited according to a conventional single coating process of the prior art. In FIG. 3, an upper surface of a laminated substrate 40 is shown with a number of plated through holes 24. Plated through holes 24 form a pattern of alternating pads 44 and 46 and spaces 48 such that a distance X (e.g., between 0.14 and 0.15 millimeters) between pads 44 and 46 is significantly larger than a distance Y between the top of pads 44, 46 and the surface of a sub-laminate layer 50 (approximately 35 microns in this example and typically between 20–40 microns). It can be seen that the dimensions X and Y form a low aspect ratio trench in the area of space 48 between pads 44 and 46.

As shown in FIG. 3, spin coated dielectric layer 41 becomes thinner where it passes over raised features 44 and 46 yielding weak points at the corners of the metal features at the top of trenches 48 as shown by regions 52. Also, due to the effects of uneven wetting, feature shadow and feature isolation, the dielectric material deposits, subsequent to curing, to a thickness dimension of Z over the pads and Z' inside the trenches. Ideally, Z' should be equal to dimension Z (10–12 microns in the preferred embodiment) plus dimension Y for a truly planar surface.

FIG. 3 also illustrates the shadow effect. On sides 54 of plated through holes 44 and 46, dielectric layer 41 is thicker along the x-axis than it is on sides 53 of the through holes. This phenomenon is referred to as the "shadow effect" because the area of extra thickness is created in the shadow of the plated through holes as the dielectric material flows over the raised holes. The shadow effect results in the distance A shown in area 52 being less than distance B shown in area 55 yielding a weak point at the corners of the metal features in areas 52 as mentioned above.

The present invention provides a method of improving the planarity of dielectric layers, such as dielectric layer 28, deposited over raised features such as pads 44 and 46 by utilizing a multistep deposition and etching process. The method of the present invention is illustrated in FIG. 4 by way of a flow chart and is described below in conjunction with FIGS. 4, 5A–5C, which are simplified cross-sectional views showing how the topology of the upper surface of a substrate similar to printed wiring board substrate 20 shown in FIG. 2 changes as a thin film dielectric layer (e.g., layer 28 in FIG. 2) is formed according to the method of the present invention.

While the details of the present invention are illustrated with respect to a printed wiring board substrate it is to be understood that the present invention can be used to improve the planarization of the thin film dielectric layers deposited over any common circuit base. As used in this application, a common circuit base is any substrate, daughter board or multichip module upon which chip-level and/or component-level interconnects are formed. Examples of common circuit bases include printed wiring board substrates, silicon substrates, ceramic substrates and aluminum substrates among others. An integrated circuit die, itself, is not a common circuit base. Instead, the bonding pads of the die would typically be connected by a first level interconnection scheme (e.g., wire bonding, tape automated bonding, flip chip bonding, etc.) to a common circuit base that includes power and ground conductors and signal interconnection lines to connect the die to other die and/or support components such as capacitors and resistors. The method of the present invention is useful in the formation of those signal interconnection lines.

Figure 4:
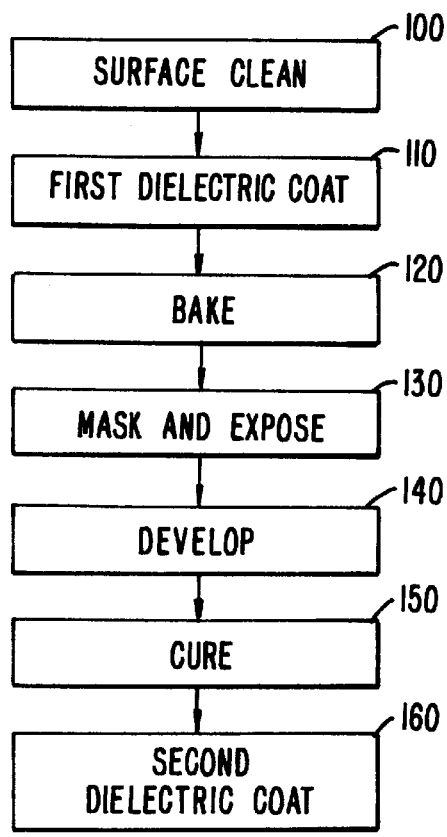
FIG. 4 is a flow chart illustrating the steps required to form a planarized thin film dielectric layer according a preferred embodiment of the method of the present invention.

Prior to the formation of a planarized dielectric layer according to the present invention, the upper surface of a printed wiring board substrate (e.g., substrate 60 shown in FIGS. 5A–5C) upon which the layer is to be formed is cleaned in preparation for thin film deposition as understood by a person of ordinary skill in the art (FIG. 4, step 100). After cleaning the substrate, a first layer 62 (FIG. 5A) of a photosensitive dielectric material (spin-coated Nippon Steel Chemical V-259PA in the preferred embodiment) is formed over the entire top surface of printed wiring board substrate 60 (FIG. 4, step 110). Photosensitive dielectric layer 62 includes stepped portions 64 that form over raised features 68 on the surface of substrate 60 and trench portions 66 that form in between the raised features.

After its formation, layer 62 is then baked in a low temperature process to remove solvent material from the dielectric layer (FIG. 4, step 120). The temperature of this bake step depends on the solvent added to the dielectric, the type of tool used to heat the substrate and other factors. When Nippon Steel Chemical V-259PA is used (this material defines both the polymer dielectric and the solvent used to dissolve the polymer) and baked in a convection oven manufactured by Blue M Electric, the layer is preferably heated to a temperature of between about 75 and 100° C. for between about 3–30 minutes. Generally, the higher range bake temperatures require a shorter bake period. It is important to note that the temperature and time used in step 120 is selected to drive the solvent out of layer 62 but not cure the layer. Curing hardens the layer and makes it insoluble to the solvent. Thus, curing the layer at this time would render the material nonphotosensitive.

Next, layer 62 is exposed to a light pattern using well known photolithographic techniques to expose a predetermined pattern in the layer (FIG. 4, step 130). In a preferred embodiment, where a negative develop process is used to pattern layer 62, the predetermined pattern mirrors the raised features on substrate 60. The pattern is such that areas 64 over raised features 68 are not exposed to the light source while areas 66 in the trenches are exposed. The result is that the dielectric material in the trenches becomes resistant to a develop solution. In another embodiment, a positive develop process can be used where the predetermined pattern mirrors the trenches.

Figure 5A:
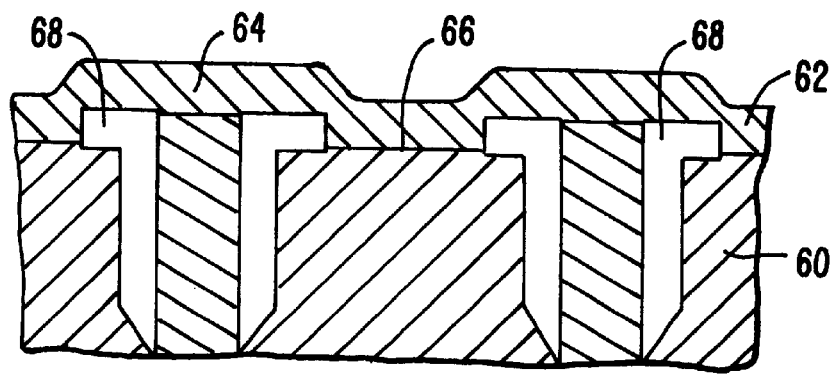
FIGS. 5A, 5B and 5C are simplified cross-sectional views showing the top surface of a laminated substrate at different steps set forth in FIG. 4.
Figure 5B:
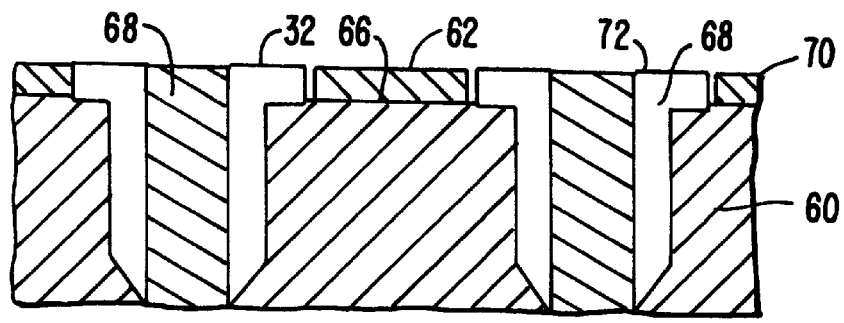

The substrate is then subjected to a develop solution to remove the unexposed dielectric material over the raised portions 68 (FIG. 4, step 140). The solution used depends on the composition of dielectric layer 62 and the type of develop process (i.e., positive or negative) employed as would be understood by a person of ordinary skill in the art. In the preferred embodiment, where Nippon Steel Chemical V-259PA is used, the solution is tetramethylammonium hydroxide (TMAH) and water as recommended by the Nippon Steel vendor. The resulting developed layer is shown in FIG. 5B. As shown in FIG. 5B, at this point in the process a substantially planar surface 70 has been created over substrate 60. Portions of planarized surface 70, however, include exposed areas of metalization 72, such as exposed land pads. These areas of metalization have been exposed as a result of the removal of the unexposed dielectric material.

Figure 5C:
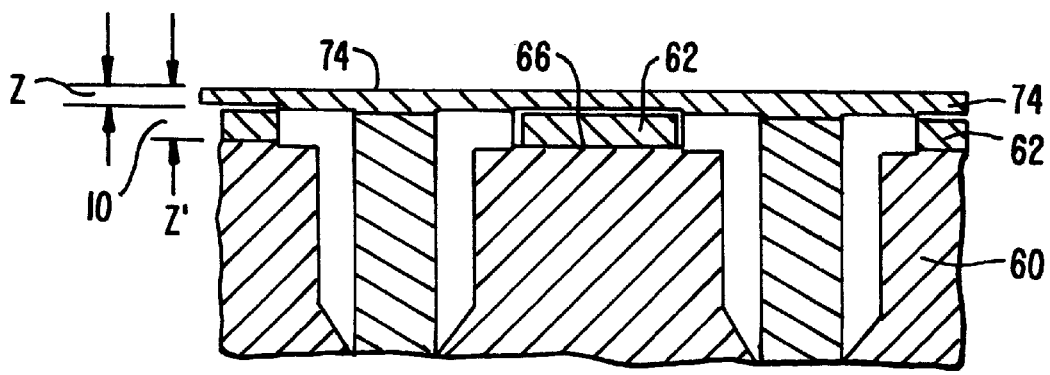

As shown in FIG. 5C, a second coat of dielectric material 74 is then spun on surface 70 to form the final, composite dielectric layer (FIG. 4, step 160). In this manner the method of the present invention creates a substantially planar surface covering both raised metalization features 68 and trenches 66 for subsequent thin film deposition. Prior to the formation of layer 74, however, layer 62 is cured in step 150. Curing layer 62 at this time makes it insoluble to the solvent present in layer 74 formed during step 160. The temperature and time for curing (step 150) depends on the polymer and tool among other factors. With the Nippon Steel material and Blue M convection oven used in this preferred embodiment, the present inventors have determined that it is preferably to heat layer 62 to a temperature of between about 130–200° C. for about 45–90 minutes (depending on the temperature) to effectively cure the layer.

In a preferred embodiment, layers 62 and 74 are both Nippon Steel Chemical V-259PA layers. As previously discussed, Nippon Steel V-259PA is a photosensitive material that can be patterned and developed in steps 130 and 140 using photolithography techniques known to those of ordinary skill in the art.

Figure 6A:
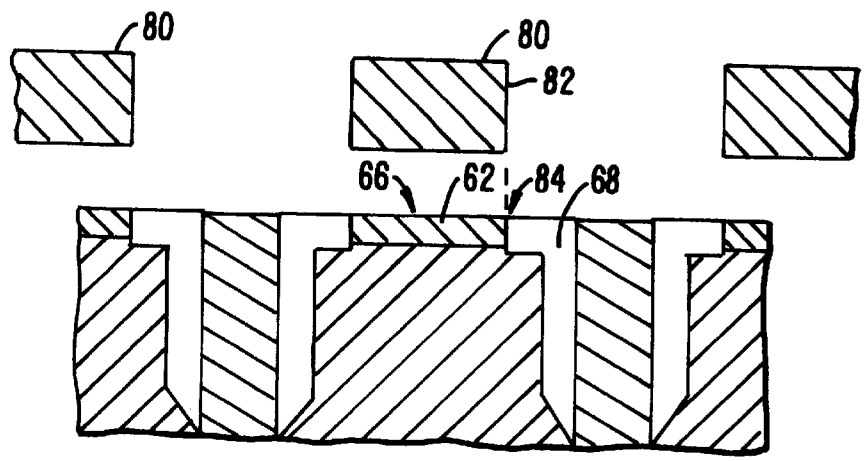
FIGS. 6A, 6B and 6C are simplified cross-sectional views showing the effects of zero, positive, and negative bias on dielectric trench fill according to different embodiments of the present invention.
Figure 6B:
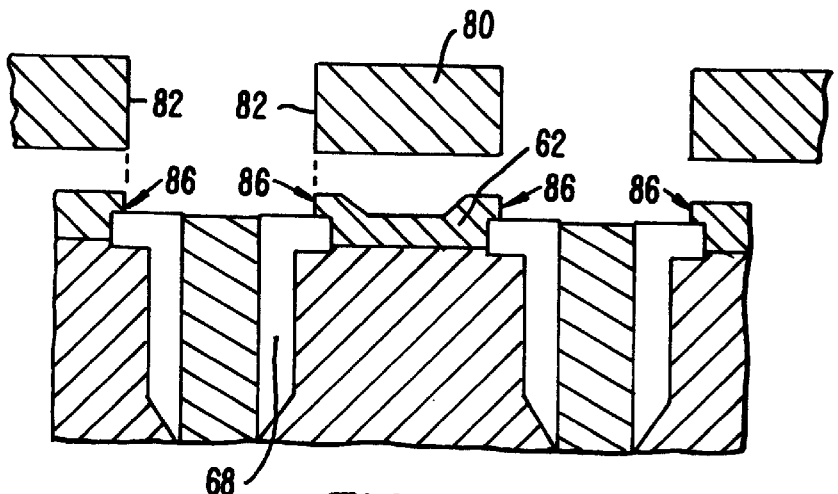
Figure 6C:
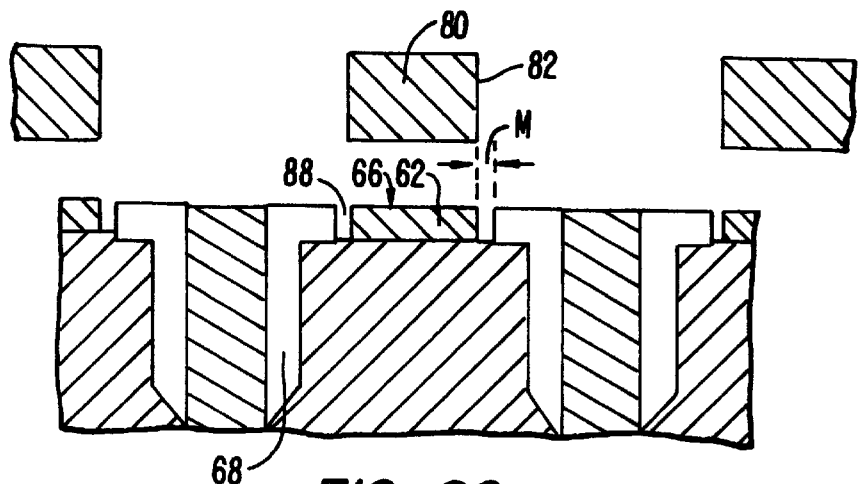

In determining the mask pattern to be used in step 120, it is important to consider the bias of dielectric layer 62, i.e., the tendency for layer 62 to completely fill, underfill or overfill trench 66 after masking and developing the layer. FIGS. 6A to 6C illustrate the differences between a zero biasing condition, a positive biasing condition and a negative biasing condition, respectively.

FIG. 6A shows a pattern mask 80 with openings to expose only the trench areas 66 of dielectric layer 62 (hence a positive develop process). Mask 80 is dimensioned such that its edges 82 correspond precisely with edges 84 of the raised features 68. This results in a zero bias condition where, after development step 130, the dielectric material just touches the side walls of the low aspect ratio trench. For ease of comparison, each of FIGS. 6A through 6C shows an already developed dielectric layer 62 with the corresponding mask 80 used to achieve the patterning of layer 62 in step 120. While a zero bias condition is optimum, the likelihood of attaining such a condition is relatively low due to accuracy limitations of mask alignment during step 120 and other factors such as substrate runout, the dimensional stability of the substrate, and light source uniformity.

FIG. 6B shows the result when a positive bias is manifested, such as might happen from alignment errors (actually, an alignment error in a zero bias mask would create a positive bias on one side of the trench and a negative bias, as described with respect to FIG. 6C, on the other side of the trench). In FIG. 6B, dielectric material has crept over the edges of the tops of the metal features creating bumps 86. When the second coat of dielectric is formed over the first layer, these bumps become non-planar features on the surface and limit the space available for formation of a via to connect to feature/pad 68. Bumps 86 are created because edges 82 of mask 80 align over raised metal features 68 on the substrate surface rather than with edges 84 of such features (a similar situation occurs in a negative develop process when the edges or mask 80, which is positioned over the raised features, align over the interior of those raised features rather than the edges). While it is possible to use a positive bias in some embodiments of the present invention, the via pads in these embodiments need to be made larger in order to compensate for the space availability problem mentioned above. Making such an accommodation limits the wiring density of the interconnect structure.

To compensate for potential non-uniformity sourced in high positive bias, in a preferred embodiment, the present invention uses a negative bias of between 3–5 microns shown as distance M in FIG. 6C. This negative bias is added in addition to any process bias. In this embodiment, pattern mask 80 is slightly smaller (about 3–5 microns smaller) than the low aspect trenches 66 (or in a negative develop process, mask 80 is slightly larger than the raised features and thus aligns over the trenches). The result of such a negative bias is the formation of high aspect ratio gaps next to the sidewalls of features 68. At these dimensions, the dielectric material added in step 150 fills and bridges the high aspect ratio gaps forming a substantially planar dielectric surface.

Having fully described one embodiment of the present invention, many other equivalent or alternative methods of ensuring the planarization of thin film dielectrics will be apparent to those of ordinary skill in the art. For example, photo-definable dielectric materials other than that employed in the preferred embodiment could be used for any or all of layers 62, 74 and/or 32. These materials include Dow BCB, Ciba Probimer and a Nippon Steel Chemical V-259PA material with a viscosity rating of 6 among others and can be successfully used if the substrate is pretreated with an adhesion promoter to reduce the effects of poor wetting. These thicker dielectrics provide improved planarization in single coats but are more fragile and more susceptible to stress cracking than thinner dielectric materials. Thicker dielectrics also tend to create a stress imbalance on the substrate that may increase warpage. If such thicker dielectrics are employed, it is preferable to add additives that mitigate the effects of cracking as is known to those of ordinary skill in the art. Low modulus materials or other rubbers can be added to improve the mechanical strength of the cured dielectric, and fused silica or other inorganic fillers can be added to reduce the propagation of a fracture once it occurs.

In other embodiments the dielectric material need not be photo defined. One example of such a dielectric material is B. F. Goodrich Avatrel. In those embodiments, the non-photo defined material can be patterned using laser ablating or plasma etching methods. Laser ablation, with current laser tools, is less desirable because it is rather slow and thus not suited for production environments. Thus, a plasma etch method that employs a sacrificial resist layer is preferred in these embodiments.

Planarizing the surface of the substrate in the manner described provides several benefits in addition to achieving a substantially planarized surface adequate for subsequent deposited laminated layers. The uniform thickness improves the impedance characteristics of the substrate, leading to higher performance of an assembled device.

Additionally, the reduced size of the signal traces and vias increases the line density thereby reducing the number of layers needed to accomplish a high density interconnect. The reduced size of the vias has a further benefit in that it reduces signal reflections as the signals transit the layers. As is known, smaller vias have less reflection because there is less inductance in the via, so the geometries achievable with this approach make it appropriate for high frequency applications where other technologies and methods are not. Smaller vias also yields greater interconnect density, which in turn yields fewer layers. Fewer layers translates into better impedance control and smaller overall size and weight.

Also, the method described eliminates the weak point (i.e., the area illustrated as distance A shown in regions 52 of FIG. 3) at the corners of the metal features at the tops of low aspect ratio features on the surface of the substrate. This significantly reduces the failure of the substrate due to cracking at the corners of the metal features at the tops of the trenches. The increase in planarity, with its attendant uniform thickness, also reduces the possibility of dielectric breakdown. Where a dielectric coat has become very thin, an electrical breakdown may occur, increasing possibility of shorts and other defects.

Finally, the highly planar nature of the surface significantly reduces the occurrences of open traces where the dielectric crosses a substrate feature. In conventional methods, the less planar nature of the surface results in uneven exposure during conductive pattern defining steps. This uneven exposure yields a high variation in exposed line width, narrowing to such an extent as to create an open trace. This problem could be avoided by using wider traces, but doing so limits wiring density.

What is claimed is:

1. A method for forming a high density interconnect scheme on a common circuit base to connect a first integrated circuit to a second integrated circuit and/or to support components, said method comprising:
    (a) providing a common circuit base having first and second patterned conductive layers formed thereon and having an upper surface, said common circuit base also having at least one trench formed on said upper surface between raised features of said first conductive layer;
    (b) forming a first layer of a dielectric film over said common circuit base and over said raised features and said trenches;
    (c) patterning said first layer to remove portions of said first layer formed over said raised features;
    (d) forming a second layer of said dielectric film over said patterned first dielectric layer;
    (e) performing additional film deposition and film patterning steps to complete the layout of a thin film interconnect structure over said common circuit base; and
    (f) attaching an integrated circuit die to said common circuit base and electrically connecting said integrated circuit die to said thin film interconnect structure.

2. The method of claim 1 wherein said first and second dielectric layers are formed by a spin coating film deposition step.

3. The method of claim 1 further including the step of attaching a second integrated circuit die to said common circuit base and electrically connecting said second integrated circuit die to said thin film interconnect structure.

4. A method for forming a planarized dielectric film on a surface of a common circuit base having raised features formed on said surface and defining a trench between said raised features, said method comprising:
    (a) forming a first layer of said dielectric film over said common circuit base and over said raised features and said trench;
    (b) patterning said first layer to remove portions of said layer formed over said raised features;
    (c) forming a second layer of said dielectric film over said patterned first dielectric layer.

5. The method of claim 4 wherein said first layer is patterned to expose portions of said raised features.

6. The method of claim 4 wherein said first layer of said dielectric film is a photo-definable material and wherein said first layer is patterned by an expose and develop sequence in which said dielectric material is exposed to light through a patterned mask and then developed with a developing solution selected for said photo-definable material.

7. The method of claim 6 wherein said expose and develop sequence is a negative develop process and wherein said mask mirrors said raised features.

8. The method of claim 6 wherein said photo-definable material comprises a cardo acrylate material.

9. The method of claim 8 wherein said cardo acrylate material comprises Nippon Steel Chemical V-259PA.

10. The method of claim 6 wherein said expose and develop sequence uses a negative bias mask during the expose phase of the sequence.

11. The method of claim 10 wherein said negative biased mask is biased between about 3 to 5 microns from edges of the raised features.

12. The method of claim 4 wherein said first layer of said dielectric film is a nonphoto-definable material and wherein said first layer is patterned by forming a layer of photoresist over said first layer and using an expose and develop sequence in which said photoresist layer is exposed to ultraviolet light through a patterned mask and then developed with a developing solution selected for said photoresist.

13. The method of claim 4 wherein said first layer of said dielectric film is a nonphoto-definable material and wherein said first layer is patterned by laser ablation techniques.

14. A method according to claim 4 where the common circuit base comprises a printed wiring board (PWB).

15. The method according to claim 14 wherein said printed wiring board (PWB) comprises:
    (i) first and second organic polymer laminate insulating layers;
    (ii) a first conductive layers formed on an upper surface of the first laminate insulating layer and a second conductive layer formed on a lower surface of the second laminate insulating layer; and
    (iii) plated through holes electrically connecting said first conductive layer with said second conductive layer.

16. The method of claim 15 wherein said PWB is a four-layer PWB.

17. The method according to claim 4 wherein said common circuit base has a total surface area of about 1400 cm$^2$ or more.

18. A method for forming a planarized dielectric film on a surface of a common circuit base having raised features formed on said surface and defining a trench between said raised features, said method comprising:
    (a) forming a first layer of said dielectric film over said common circuit base and over said raised features and said trench, wherein said first layer of said dielectric film is a photo-definable material that comprises a polymer dielectric and a solvent;
    (b) thereafter, baking said first layer to remove at least some of said solvent material from said first dielectric layer;
    (c) thereafter, exposing said first dielectric layer to patterned light;
    (d) thereafter, developing said exposed first dielectric layer to etch away portions of said first dielectric layer formed over said raised features;
    (e) thereafter, curing said developed first dielectric layer; and
    (f) thereafter, forming a second layer of said dielectric film over said developed first dielectric layer.

19. The method of claim 18 wherein said first layer is baked at a temperature of between 75 and 100° C. in a convection oven for between 3 and 30 minutes to remove solvent from said layer.

20. The method of claim 18 wherein said first layer is baked at a temperature of between 130 and 200° C. in a convection oven for between 45 and 90 minutes to cure said layer.

21. The method according to claim 18 wherein the common circuit base comprises a printed wiring board (PWB) and wherein said printed wiring board (PWB) comprises:

(i) first and second organic polymer laminate insulating layers;

(ii) a first conductive layers formed on an upper surface of the first laminate insulating layer and a second conductive layer formed on a lower surface of the second laminate insulating layer; and (iii) plated through holes electrically connecting said first conductive layer with said second conductive layer.

* * * * *